United States Patent [19]

Kennon et al.

[11] Patent Number: 4,649,569
[45] Date of Patent: Mar. 10, 1987

[54] TRANSCEIVER WITH AUTO FREQUENCY SENSE

[75] Inventors: Jerry M. Kennon; James V. Faulkner, Jr.; Theodore H. York, all of Raleigh, N.C.

[73] Assignee: Westinghouse Electric Corp., Pittsburgh, Pa.

[21] Appl. No.: 615,867

[22] Filed: May 31, 1984

[51] Int. Cl.$^4$ .................... H04B 17/00; G01R 23/14
[52] U.S. Cl. ...................... 455/67; 455/115; 324/79 D
[58] Field of Search ............ 455/24, 115, 67, 77, 455/185, 186, 73; 324/79 D, 79 R, 78 D; 340/310 A; 364/484

[56] References Cited

U.S. PATENT DOCUMENTS

| | | | |
|---|---|---|---|
| 4,128,808 | 12/1978 | Westra | 455/115 |
| 4,236,110 | 11/1980 | Shearer et al. | 324/79 R |
| 4,291,269 | 9/1981 | Nossen | 324/79 D |
| 4,361,904 | 11/1982 | Matsumura | 455/67 |
| 4,420,769 | 12/1983 | Novak | 455/67 |

FOREIGN PATENT DOCUMENTS

2052901 1/1981 United Kingdom .
1600555 10/1981 United Kingdom .

Primary Examiner—Jin F. Ng
Assistant Examiner—Curtis Kuntz
Attorney, Agent, or Firm—William D. Lanyi

[57] ABSTRACT

A transceiver is provided with a means for determining its own prescribed frequency upon the occurrence of an adverse transient condition, such as lightning, or upon initial installation after manufacture. Since it can safely be assumed that a transceiver's prescribe reception frequency is the same as its transmission frequency, the present invention measures the period of its transmission frequency in order to determine the frequency of its reception frequency. The exact frequency of incoming demodulated messages must be known in order for the transceiver's digital demodulator to properly demodulate the incoming signals. A high frequency signal, such as 1 mHz, is used to increment a pulse counter and the values of this pulse counter are stored upon the occurrence of two successive negative edges of the carrier signal. The present invention also provides means for directing its carrier signal to an input port of its microprocessor during power-up sequence in order for the period of the carrier signal to be easily measured.

4 Claims, 4 Drawing Figures

TRANSCEIVER WITH AUTO FREQUENCY SENSE

BACKGROUND AND SUMMARY OF THE INVENTION

The present invention relates generally to apparatus which transmits and receives modulated signals and, more particularly, to a transceiver which is capable of determining its prescribed reception frequency by measuring the frequency of its carrier signal output.

Power line communication systems are used to communicate between stations that are operatively coupled to a power line. A typical application of a power line communication system is used by an electrical utility to communicate between a central station and a plurality of remote stations. A central communications unit is located at a central station and is operatively coupled to the power line. This central station is equipped to transmit commands to thousands of remote locations which are equipped with receivers that are also operatively coupled to the power line. At the remote locations, such as consumer residences, the receivers are typically incorporated in load management terminals. The load management terminals are connected to non-essential electrical equipment, such as air conditioners or water heaters, that can be shed during periods of peak electrical power usage. Each load management terminal is assigned a unique address in order to permit the central station to selectively send commands to a particular consumer residence or request data therefrom. In this type of system, messages can be sent from the central station to the remote station and, in some applications, vice versa. The message emanating from the central station would include load shedding commands or requests for meter readings. Return messages from the remote stations could be status reports or meter readings.

U.S. Pat. No. 4,130,874 which issued to Pai on Dec. 19, 1978 discloses a load management terminal having a plural selectable address formats for a power line communication system. A distribution network communication system having branch connected repeaters is disclosed in U.S. Pat. No. 4,250,489 which issued to Dudash on Feb. 10, 1981. Various types of load management terminals that can be used with power line communication systems are known to those skilled in the art. U.S. Pat. No. 4,429,366 which issued to Kennon on Jan. 31, 1984 discloses a microprocessor-based load management terminal with reset capability. Also, a load management terminal is disclosed in U.S. Pat. No. 4,402,059 which issued to Kennon et al. on Aug. 30, 1983. Load management terminals are provided with digital demodulators that are capable of demodulating incoming messages received from the power line. For example, a coherent phase shift keyed demodulator for power line communication systems is disclosed in U.S. Pat. No. 4,379,284 which issued to Boykin on Apr. 5, 1983 and a coherent phase shift keyed demodulator is disclosed in U.S. Pat. No. 4,311,964 which issued to Boykin on Jan. 19, 1982.

Although various techniques of power line communication systems are known to those skilled in the art, one particular technique is to modulate a carrier signal with a base band data message and inject the modulated signal onto the power line. This modulated signal would be transmitted along the power line and, when received by another station, the message would be subsequently demodulated and interpreted. Various modulation techniques are known. One particular modulation technique involves a phase shift keyed (PSK) modulation, by a base band data signal, of a higher frequency carrier signal. A typical carrier signal in this type of application would be approximately 12.5 kHz and the base band data signal would be approximately 76 baud. The base band data signal and the carrier signal, in a phase shift keyed system, are introduced as separate inputs into an exclusive-OR (EOR) gate. Changes in the logical state of the base band data message cause the phase of the carrier signal to be shifted.

When the phase shift keyed message is received by a remote station, it is demodulated and the message is decoded. A digital demodulator suitable for demodulating messages of this type is disclosed in U.S. Pat. No. 4,311,964 which issued to Boykin on Jan. 19, 1982. Improved digital demodulators are disclosed in U.S. Pat. Nos. 4,514,697 and 4,516,079 which issued to York. A more recent improved digital demodulator is disclosed in U.S. Pat. No. 4,563,650 which issued to York et al. Although these digital demodulators are particularly well suited for demodulating phase shift keyed messages, other demodulating apparatus could also be used.

Regardless of the particular demodulating technique used, the carrier frequency must be known in order that the demodulator can effectively sample the incoming signal during the demodulating process. Since the demodulator must be able to discern a valid incoming message from spurious electrical noise, precise sampling techniques are used and the results of these sampling techniques are subjected to an algorithm to determine whether a valid incoming message is being received and to demodulate the message. The known frequency of the incoming message is used to determine the period of time between samples. If the digital demodulator did not know, in advance, the frequency of the incoming message, proper demodulation of the message would be impossible.

Transceivers which are used in conjunction with power line communication systems are initially provided with information relating to the frequency of messages which will be incoming to the transceiver. If all transceivers were intended for use with a single frequency, the value of this single fixed frequency could be incorporated within the demodulating algorithm. However, since various carrier signal frequencies are used in different power line communication systems, some means must be provided for informing the digital demodulator of the exact prescribed frequency value of valid incoming messages.

Since typical power line communication devices, such as the load management terminals, comprise microprocessors which are used to demodulate and decode incoming messages, the prescribed transmission and reception frequency for the transceiver can be stored in the memory of the microprocessor. Typically, this value would be stored in a location of the microprocessor's read-only memory (ROM). Since a typical design of a load management terminal could utilize any one of a plurality, such as eight, of possible carrier signal frequencies, the stored value of the prescribed frequency for a particular transceiver would be one of eight preselected values. Although the use of read only memory (ROM) provides non-volatile storage of the prescribed frequency values which is not susceptible to loss during power outages, severe electrical transients, such as lightning, could possibly have an adverse effect on the non-volatile random access memory NOVRAM location containing the selected value. If, for some reason, the selected value of the prescribed frequency is destroyed, the digital demodulator would not be able to properly demodulate incoming carrier-based signals.

This problem can be addressed in various ways. One possible means for preventing the loss of the prescribed value during electrical transient conditions would be to fix this value with hardware. For example, three switches would provide sufficient resolution to store the binary representation for one of eight possible frequencies to designate the prescribed frequency of the transceiver. This type of hardware storage of the frequency value would be immune to electrical transient conditions. However, a significant disadvantage of this method is that both the transmitter and the receiver would have to be individually configured at additional cost and would require the use of port pins on the microprocessor that are needed for other functions. Another way to address the problem of possible loss of memory relating to the prescribed frequency value is to custom design the demodulator algorithms to be applicable to only one frequency. This technique also has severe disadvantages. The digital demodulator of the transceiver, which is typically "masked" to a read-only memory (ROM), would then be unique to a single frequency and would not be applicable to transceivers which require alternate frequencies. Therefore, no single ROM would be appropriate for general use in all transceivers. Additional costs would be incurred, not only in the individual designing of these multiple digital demodulators, but also in the inventory requirements and particularly assembly procedures that would also be necessitated.

It is therefore advantageous to provide a transceiver with the flexibility to adapt to one of a plurality of possible carrier frequencies without having to manufacture distinct transceivers for each frequency. The present invention provides a transceiver that is capable of determining its own prescribed receiver frequency following a power outage or other transient condition.

The present invention comprises a means for generating a high frequency signal that has a higher frequency than any potential carrier frequency. In a preferred embodiment of the present invention, this high frequency signal has a frequency of 1 mHz. The present invention also comprises a means for generating a signal when a negative edge of a carrier signal occurs. It should be understood that the present invention could operate alternatively by responding to a positive edge of the carrier signal, but the preferred embodiment described herein is configured to be responsive to negative edges.

The present invention also incorporates a counter which accumulates a value which is representative of the number of pulses, or changes of logical state, of the high frequency signal. By storing the value of this counter upon successive occurrences of negative edges of the carrier signal, the number of pulses that occur during one period of a carrier signal can be determined. If the period of a signal is known, the frequency of that signal can easily be calculated. More simply, since the period can be determined by multiplying the number of pulses stored in the above-described counter by the known period of the higher frequency signal, the result of this calculation can be compared to a look-up table to directly determine the frequency of the measured carrier signal. After this interval is determined, it can therefore be compared to a look-up table which contains all of the possible frequencies for the transceiver. After matching this interval with one of the frequencies of the look-up table, the prescribed frequency of the transceiver can be stored in the NOVRAM.

Since the frequency of transmission by the transceiver would be identical to the frequency of incoming signals or have a known relationship (such as ±2 kHz) with the frequency of incoming signals, the ability to determine its own output frequency, which is actually measured, would provide the transceiver with the ability to determine expected incoming frequency. The functions of counting the high frequency pulses, responding to the negative edges of the carrier frequency and determining the interval between successive negative edges is accomplished by a microprocessor in a preferred embodiment of the present invention.

BRIEF DESCRIPTION OF THE DRAWING

The present invention will be more fully understood by a reading of the description of the preferred embodiment in conjunction with the drawing, in which.

DESCRIPTION OF THE PREFERRED EMBODIMENT

The present invention relates generally to transceivers and, more particularly, to a transceiver which is configured in such a way that it is capable of determining its own prescribed carrier frequency for reception by momentarily generating its transmission carrier frequency and measuring its period. Since the frequencies of transmission and reception are the same or have a known relationship to each other, the transceiver made in accordance with the present invention is therefore able to accurately determine the frequency of modulated incoming messages even though this information had been previously lost due to some electrical transient condition, such as lightning.

Figure 1:
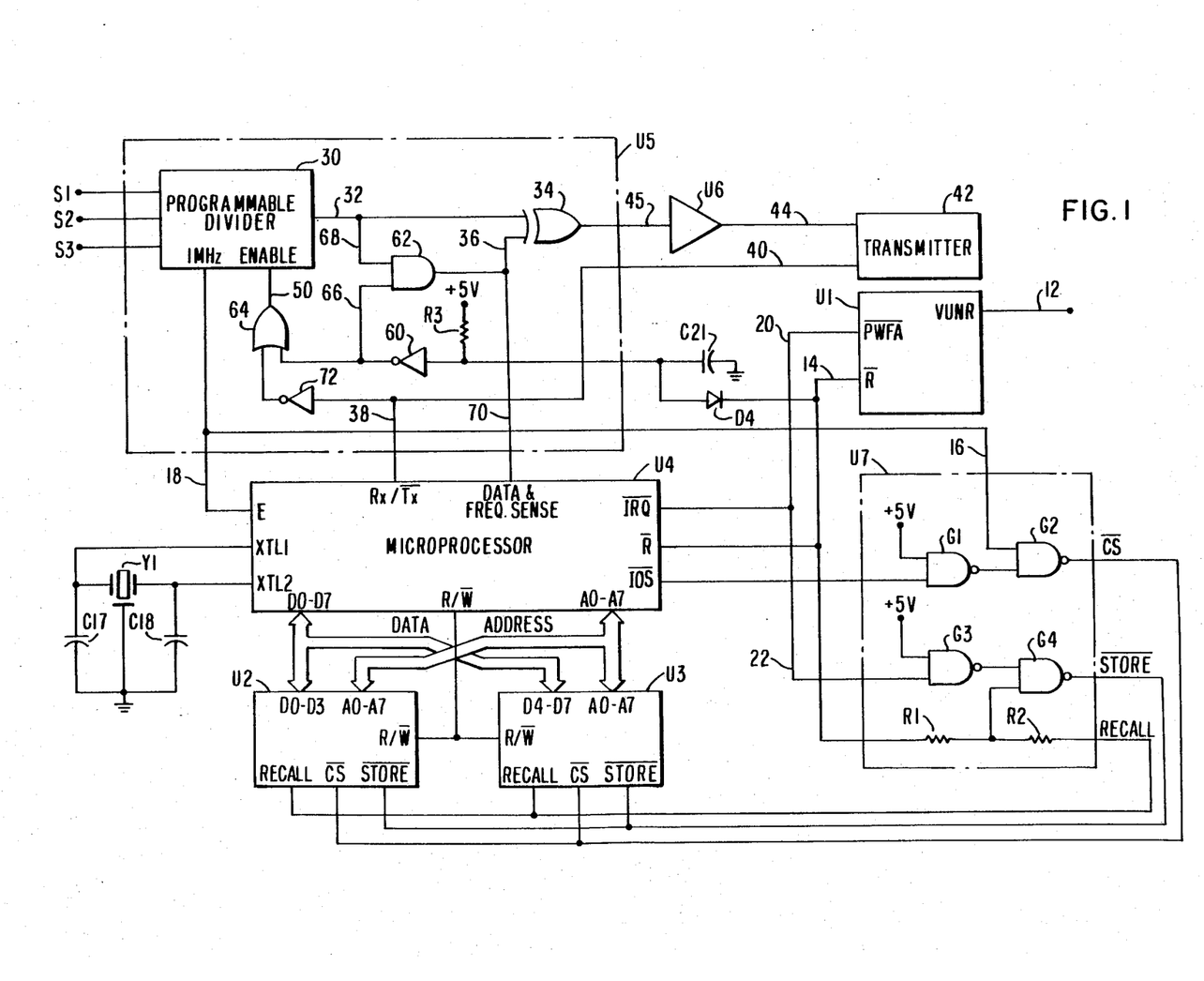
FIG. 1 represents an electrical schematic of a transceiver within the scope of the present invention.

FIG. 1 is a schematic which illustrates the pertinent components of a transceiver made in accordance with the present invention. Prior to a detailed discussion of the interrelationships between the components of FIG. 1, each major component will be discussed individually.

The microprocessor U4 is an eight-bit, single-chip microcomputer unit which includes an MC6801 microprocessor unit which is upward object-code compatible with the MC6800. The microprocessor U4 can function as a monolithic microcomputer or can be expanded to a 64K byte address space. It is TTL-compatible and requires one 5 volt power supply. It includes 4096 bytes of ROM, 192 bytes of RAM, a serial-communications interface, parallel I/O and a 16-bit six-function programmable timer. In a preferred embodiment of the present invention, the microprocessor U4 is type MC6801U4 which is available from the Motorola Corporation. In the preferred embodiment of the present invention, the microprocessor U4 would contain numerous software programs which are related to the operation of a load management terminal, a repeater or any other type of two-way communications device. For example, the digital demodulator would be a software program stored in its memory. The demodulator disclosed in U.S. Pat. No. 4,311,964 or in U.S. Pat. Nos. 4,514,697 and 4,516,079 represents exemplary digital demodulators which would be stored and operated in the microprocessor U4. It should be understood that the microprocessor U4 would also contain programs for performing various other I/O functions, calculating electrical usage, and responding to various load shedding commands received from the central station described above.

The custom chip U1 includes a receiver front end and deadman circuits which provide operative support to the microprocessor U4. Relating to the preferred embodiment of the present invention, the custom chip U1 senses the occurrence when the unregulated voltage source (VUNR) achieves a value that is sufficient to permit operation of the circuitry of FIG. 1. This would occur during the power-up sequence following a power failure. Although the custom chip U1 would typically be designed to perform many functions relating to the operation of a power line communications device, only the particular functions that are related to the operation of the present invention will be discussed below.

The custom chip U1 is connected, by line 12, to the unregulated voltage source (not shown in FIG. 1) and, when a sufficient unregulated voltage level is achieved (approximately 10 volts), the reset signal $\overline{R}$ is released, on line 14, from the custom chip U1 to the microprocessor U4. This reset signal $\overline{R}$, as indicated in FIG. 1, is also received by the semiconductor chip U7 and the semi-custom chip U5.

The semiconductor chip U7 comprises four NAND gates, G1-G4, as shown. One of its functions is to combine a 1 mHz signal, received from the microprocessor U4 on line 16, with the $\overline{IOS}$ output from the microprocessor U4 to form a chip select signal CS. The 1 mHz signal is output from the microprocessor on line 18 and is directed, on line 16, to NAND gate G2 of the semiconductor chip U7. The chip select signal CS is then received by the non-volatile memory (NOVRAM) components, U2 and U3. When the chip select signal CS is enabled, the memory responds to signals from the read/write (R/$\overline{W}$) outputs of the microprocessor U4. Also, the semiconductor chip U7 operates, in cooperation with the custom chip U1, to provide a controlled power-down sequence when a power failure occurs. If a loss of power is sensed by the custom chip U1, a power fail signal ($\overline{PWFA}$) is sent, on line 20, to both the microprocessor U4 and the semiconductor chip U7. When a power-fail condition is sensed by the custom chip U1, this $\overline{PWFA}$ signal is sent to the microprocessor, via the $\overline{IRQ}$ interrupt signal to immediately cease operation and rapidly prepare itself for an imminent loss of power. This signal is also sent, on line 22, to NAND gate G3 of semiconductor chip U7. Typically, the microprocessor U4 would have approximately 3 milliseconds to perform its required functions between the occurrence of the interrupt request $\overline{IRQ}$ signal and a total loss of power. At the end of this power-fail delay period, the reset signal $\overline{R}$ is placed in a logically low condition. When this occurs, NAND gates G3 and G4 cooperate to cause a memory STORE signal to be sent to the non-volatile (NOVRAM) components, U2 and U3.

The non-volatile memory (NOVRAM) components, U2 and U3, permit the microprocessor U4 to store its memory during power-fail conditions. In a preferred embodiment of the present invention, the NOVRAM's, U2 and U3, are type 2212 which are available from the XICOR Corporation. This particular type of NOVRAM is particularly advantageous because it comprises both random access memory (RAM) and electrically erasable programmable read-only memory (EEPROM). Each memory location of the NOVRAM really comprises two associated memory locations. This type of configuration is known to those skilled in the art as "shadow-RAM". The RAM portion of the NOVRAM components is a normal read/write memory that can run at regular bus speeds and is treated in a manner similar to any other kind of memory. During operation of the present invention, the microprocessor U4 can therefore read and write from the NOVRAM's, U2 and U3, in a normal manner. Many types of data are stored in the RAM. For example, the unique address of a load management terminal which comprises the transceiver, electrical power consumption data and many other types of information are passed between the microprocessor U4 and the NOVRAM's. Other types of information stored in the RAM include load timers, receive and transmit buffers, status information, time, configuration data and the result of the transceiver carrier frequency test that is a result of the operation of the present invention. However, when a power failure occurs, the RAM memory of the NOVRAM's, U2 and U3, is copied into its shadow-RAM which is EEPROM. This would occur when a power-failure condition is sensed. As described, a $\overline{PWFA}$ signal is sent, on line 20, from the custom chip U1 and is received as an $\overline{IRQ}$ interrupt by the microprocessor U4. This signal is also simultaneously received, on line 22, by the semiconductor chip U7. This signal results in a STORE signal which is sent from the semiconductor chip U7 to the NOVRAM's, U2 and U3. The transfer of the information from RAM to EEPROM takes approximately 10 milliseconds and the time between the $\overline{PWFA}$ signal and the complete loss of power is extended by the use of a capacitor circuit which stores enough energy to provide power to the NOVRAM's until their transfer of data is completed. Therefore, following a power failure, important information is stored in the EEPROM portion of the NOVRAM's.

Following the termination of a power failure time period, when the unregulated voltage VUNR rises to an acceptable level, the reset signal $\overline{R}$ is released and rises to a logical high signal on line 14 from the custom chip U1 to both the microprocessor U4 and the semiconductor chip U7. This reset signal not only informs the microprocessor U4 that sufficient power is available for operation, but also causes a RECALL signal to be generated from the semiconductor chip U7 to the NOVRAM's U2 and U3. When this RECALL signal is received by the NOVRAM's, they copy the stored information from their EEPROM memory to their RAM memory. Once transferred to the RAM, this data can be easily manipulated by the read/write functions of the microprocessor U4.

As can be seen in FIG. 1, the NOVRAM's, U2 and U3, are associated with the microprocessor U4 in both address and data communications. Since the NOVRAM's are organized in a four-bit configuration, each eight-bit byte of data transferred to or from the microprocessor U4 is split in half and stored in both NOVRAM's. Data bits 0 to 3 (D0-D3) are stored in NOVRAM U2 and data bits 4 to 7 (D4-D7) are stored in NOVRAM U3 as shown in FIG. 1. The microprocessor U4 also transfers an eight-bit address to both NOVRAM's in order to identify each byte of data transferred to or from the NOVRAM's.

The microprocessor U4 is also associated with a crystal Y1 which is capable of providing a 4 mHz stream of pulses to the XTL1 and YTL2 inputs of the microprocessor U4. The 4 mHz signal is divided, by the microprocessor U4, to a 1 mHz signal which is output from the microprocessor, on line 18, to both the semiconductor chip U7 and a semi-custom chip U5.

The semi-custom chip U5 is specifically designed to perform many functions relating to the operation of two-way communications devices. Although the semi-custom chip U5 includes numerous other components, only those components of semi-custom chip U5 which are related to the operation of the present invention will be discussed herein. The semi-custom chip U5 comprises a programmable divider 30. The programmable divider 30 has three select port pins, S1–S3, which are used to determine the frequency of the carrier signal used for transmission. The use of the three select ports, S1–S3, represent three binary bits that provide a choice of eight unique frequencies of carrier signal. The programmable divider 30 divides the 1 mHz input frequency to one of these eight output frequencies based on the hardware strapping of these three ports. In a preferred embodiment of the present invention, the eight available output carrier frequencies are: 7.35 kHz, 7.81 kHz, 8.33 kHz, 8.93 kHz, 9.62 kHz, 10.42 kHz, 12.5 kHz and 13.89 kHz. Based on the particular strapping of the port pins, S1–S3, one of these eight carrier frequencies would be constantly output, on line 32, to a modulator 34 when the programmable divider 30 is enabled by a signal on line 50. The modulator 34, as illustrated in FIG. 1, is an exclusive-OR (EOR) gate with two inputs. One of the inputs, as described above, is the carrier signal received from the programmable divider 30 on line 32. The other input to the modulator 34 is a base band data signal, on line 36, received from the data output port of the microprocessor U4. The modulator 34 operates as a normal EOR gate and, therefore, logic level changes of the base band data signal cause phase shifting of the carrier signal as it is output from the modulator 34. During normal operation, a transmitted signal is first coded into a base band data format and then is used to modulate the carrier signal by the modulator 34. When a signal is being transmitted by the microprocessor U4, a Rx/Tx signal is output by the microprocessor U4, on lines 38 and 40, to a transmitter circuit 42. Although not particularly illustrated in FIG. 1, it should be understood that the Rx/Tx signal, on line 40, would be used as one of two inputs to an AND gate within the transmitter circuitry. The other input to this AND gate would be received on line 44. Therefore, it should be understood that both signals would be required for transmission of a modulated message by the transmitter 42 by injection onto the power line. Modulated data, after being output by the modulator 34 on line 45, is amplified by the amplifier U6 and sent to the transmitter 42 on line 44. The transmitter 42 is coupled to a power line system in such a way so as to be able to inject the modulated signals onto the power line when a signal on line 40 is received.

The discussion above relating to the modulator 34 and amplifier U6, along with their related signals on lines 36, 38, 40, 44 and 45, relates to normal message transmissions. However, it should be understood that the importance of the present invention is related more directly to the very short period of time that occurs, following the end of a power failure, immediately after a reset signal is output from the custom-chip U1 on line 14. After sufficient voltage is restored to the system, the present invention operates to determine the proper frequency to be used by the digital demodulator which would be incorporated within the microprocessor U4.

Prior to describing the present invention in detail, a few important aspects of FIG. 1 must be discussed. It should be understood that the programmable divider 30 requires an ENABLE signal, on line 50, before it will output a carrier signal on line 32. Furthermore, during a power outage condition of any significant duration, capacitor C21 will be discharged. Also, the I/O port of microprocessor U4 which is labeled "DATA AND FREQUENCY SENSE" serves as both an input and an output port. During normal operation, this I/O port of the microprocessor U4 operates to output base band data messages to the modulator 34 on line 36. However, during a power-up situation, this I/O port is used as an input port to receive a carrier signal.

The present invention operates during a power-up sequence to determine the frequency of its prescribed carrier signal. As discussed above, the present invention operates on the basic assumption that the same frequency of carrier signal would be used for both receiving signals from a power line and transmitting signals to it. Therefore, if the microprocessor U4 is able to determine the frequency of the carrier signal being output by the programmable divider 30 on line 32, it will also be able to determine its prescribed input frequency which is an important criterion for its digital demodulator.

In order to fully understand the operation of the present invention, it is necessary to understand the conditions of various portions of the circuitry of FIG. 1 during a power fail condition and immediately after restoration of power. Therefore, the operation of the present invention will be described below with reference to the voltage level and logical state of relevant components and signals.

Following a power failure, when no voltage is available to the circuitry of FIG. 1, the $\overline{R}$ signal from the custom-chip U1 is at a logical low level. Similarly, the 5 volt supply, which is connected to resistor R3 of the semi-custom chip U5, is unavailable. Therefore, there is no voltage drop across either resistor R3 or diode D4 and capacitor C21 is discharged.

At the instant that power is returned to the system, the unregulated voltage VUNR begins to rise. When the value for VUNR, sensed by the custom-chip U1, rises to a predetermined threshold, a logical high $\overline{R}$ signal is output on line 14. At essentially the same time, the positive 5 volt supply is available to the semi-custom chip U5, where it is shown connected to resistor R3. The $\overline{R}$ signal is immediately available to the microprocessor U4 because of its direct connection, by line 14, to the custom chip U1. At that same initial instant of the power-up sequence, the logically high $\overline{R}$ signal is able to pass through diode D4 and the 5 volt supply of semi-custom chip U5 is able to pass a current through resistor R3. Normally, the voltage available across resistor R3 and diode D4 would cause the input of inverter 60 to go high and, therefore, output a logically low signal, on line 66, to NAND gate 62. However, it must be remembered that capacitor C2 is discharged at this instant following the initialization of the power-up sequence and, therefore, as capacitor C21 is charging, the voltages from the $\overline{R}$ signal on line 14 and the 5 volt power supply of the semi-custom chip U5 are not available to the input of the inverter 60. Because of this, the input of the inverter 60 remains low and its output remains high. The presence of the charging capacitor C21 is very important to the present invention because it causes this logically high output from the inverter 60. This output from the inverter 60 performs two important functions. First, this logically high output from the inverter 60 provides a logically high input to the OR gate 64. Since one of the two inputs of the OR gate 64 is therefore high, a logically high output is provided from the OR gate 64, on line 50, to the ENABLE port of the programmable divider 30. This causes the programmable divider to output its carrier signal on line 32. A second important function performed by the logically high output of inverter 60 is that it provides a logically high input to NAND gate 62 on line 66. Meanwhile, the carrier signal which is output on line 32 from the programmable divider 30 is directed to the other input of the NAND gate 62, on line 68.

As long as the output of inverter 60 is in a logically high state, the carrier signal, from lines 32 and 68, are passed through the NAND gate 62 onto line 70. Therefore, this carrier signal is available, on line 70, to the input port of the microprocessor U4 for measurement of its period and determination of its frequency.

As the capacitor C21 charges, the input to inverter 60 will eventually reach a logically high level. In a preferred embodiment of the present invention, this charging time takes approximately 0.3 milliseconds. After capacitor C21 is charged and the input to the inverter 60 reaches a logically high level, the output of inverter 60 becomes logically low and, therefore, one of the inputs to NAND gate 62 is logically low. Also, the output from inverter 60 would no longer provide a logically high input to OR gate 64. Therefore, since the output of inverter 72 is logically low during a power-up sequence, the output from the OR gate 64, on line 50, is logically low and the programmable divider 30 is no longer enabled to output the carrier signal on line 32. However, during the charging time of the capacitor C21, the microprocessor U4 has sufficient time to measure the period of the carrier signal, which is input on line 70, and determine its frequency period.

As discussed above, the crystal Y1 provides a 4 mHz signal to the microprocessor U4. As also discussed above, the microprocessor U4 reduces this frequency to 1 mHz and outputs that signal on line 18 to the programmable divider 30 and the semiconductor chip U7. The present invention makes use of this 1 mHz signal, within the microprocessor U4, for an accurate measurement of the period of the carrier signal being input on line 70. During the operation of the present invention, the microprocessor U4 has two signals available to it. One is the carrier signal which has a frequency of approximately 7.35 kHz to 13.8 kHz and the other signal is the 1 mHz signal which has been reduced from the 4 mHz input received from the crystal Y1.

FIG. 1 illustrates the hardware components utilized by the present invention. Below, the logical procedures performed by the microprocessor U4 will be described in detail along with a discussion relating to the pertinent wave forms.

Figure 2:
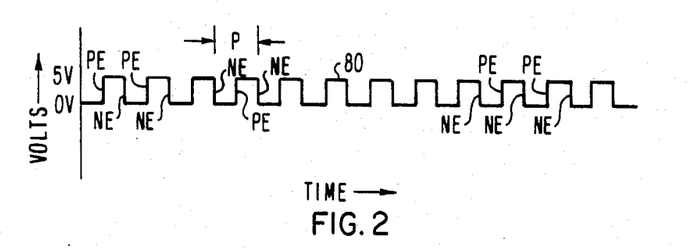
FIG. 2 illustrates a typical carrier signal.

FIG. 2 illustrates the typical carrier signal 80. As discussed above, a carrier signal used in accordance with the present invention could vary in frequency from 7.35 kHz to 13.8 kHz, depending upon the selected frequency indicated by the straps (reference numerals S1-S3 of FIG. 1) of the programmable divider. The square wave carrier signal 80 consists of a series of alternating logic level changes and therefore comprises a series of positive edges PE and negative edges NE. The time between successive negative edges describes the period P of the carrier signal 80. Of course, if this period P can be measured, the frequency of the carrier signal 80 can be determined.

Figure 3:
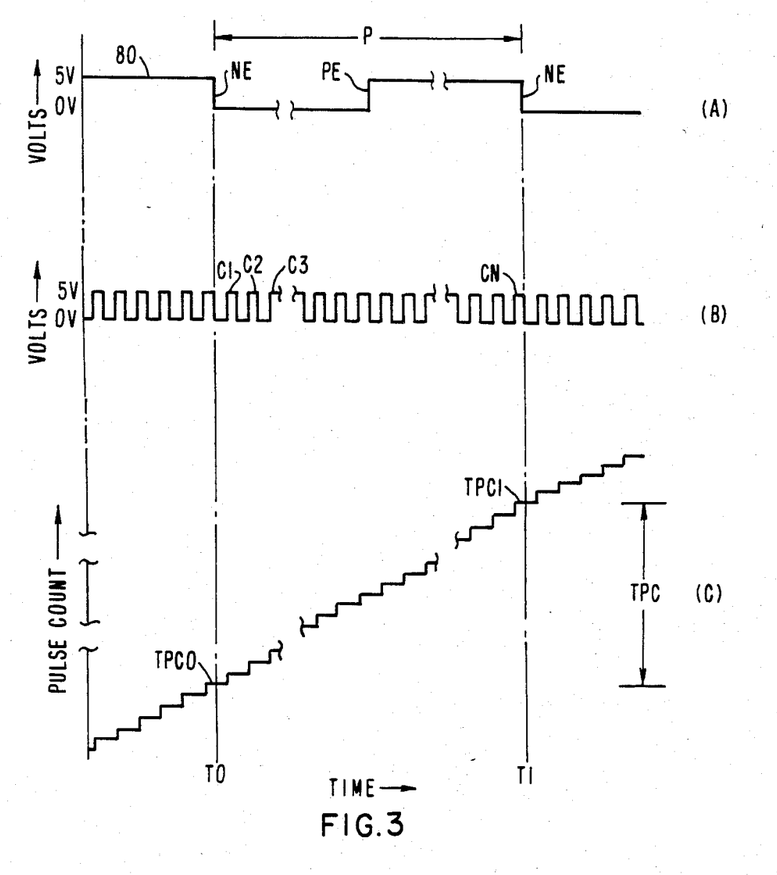
FIG. 3 illustrates a typical carrier signal, a high frequency signal and the related pulse count during the determination of a single period of the carrier signal.

FIG. 3 illustrates three curves which are plotted on the same time scale. Wave form 3A is an expanded view of the carrier signal 80 of FIG. 2. The distance between two successive negative edges represents the period P of the wave form. Wave form 3B represents a higher frequency signal that is used to measure the period P of the carrier signal 80. In a preferred embodiment of the present invention, wave form 3B would have a frequency of 1 mHz since a signal of that frequency is readily available for the reasons discussed above in relation to the microprocessor (reference numeral U4 in FIG. 4). The 1 mHz signal of wave form 3B is operatively associated with a counter that is responsive to each successive pulse of wave form 3B by incrementing the value of its contents. This incrementing pulse count is schematically represented by curve 3C.

The microprocessor of the present invention can easily be configured to generate an interrupt signal based on the occurrence of either a negative edge NE or a positive edge PE of a designated wave form. In the preferred embodiment of the present invention, the microprocessor is configured to generate an interrupt upon each occurrence of a negative edge NE of the wave form 3A, which is the carrier signal of the transceiver. Upon each occurrence of the negative edge interrupt, an interrupt capture flag (ICF) is set and a relatively short software program senses this flag and stores the instantaneous value of an input capture register (ICR) upon its occurrence. This program can, therefore, observe the value of the counter, which is known as the input capture register (ICR), for two successive interrupts and determine the magnitude change of the ICR between two successive negative edges. Regardless of the value of the ICR when the first of the two ICF's occur, the program can determine the number of pulses that occurred between the successive negative edges by subtracting the initial value of the ICR from the subsequent value of the ICR. Since the frequency of wave form 36 is known to be 1 mHz, the period of time that occurs between successive negative edges of the carrier signal 80 can be calculated.

As an example of the operation of the present invention, an exemplary sequence of events will be described in relation to FIG. 3. For purposes of this example, it will be assumed that the wave form 3A, which is the carrier signal 80, has a frequency of 12.5 kHz. Of course, during the operation of the present invention following a power-up sequence, this frequency is unknown and must be determined. When the microprocessor (reference numeral U4 in FIG. 1) is first caused to be operative following a power failure condition, the software program of the present invention is executed. At some period of time, prior to the instant illustrated as time T0 in FIG. 3, the input capture flag (ICF) of the microprocessor is armed in order that a subsequent negative edge will be generated upon the following occurrence of a negative edge of the wave form 3A. The 1 mHz signal, wave form 3B, is generating its pulses at this time and the input capture register (ICR)

is accumulating the pulse count associated with wave form 3B. Upon the occurrence of the first negative edge NE of the carrier signal 80 the input capture flag (ICF) is set. This occurs at time T0. The program immediately stores the initial ICR value of the total pulse counts at time T0. This total pulse count is indicated by TPC0 in FIG. 3. The program would then monitor the input capture flag ICF in order to determine the occurrence of the immediately subsequent negative edge NE of the wave form 3A. During this time, prior to the subsequent occurrence of the next negative edge NE, the 1 mHz signal continues to cause the input capture register (ICR) to accumulate the pulses which are illustrated as C1, C2, C3 ... CN in FIG. 3. When the next negative edge NE occurs, the input capture flag (ICF) is set and the program responds by immediately storing the value of the input capture register (ICR) at that time. As illustrated in FIG. 3, this second negative edge occurs at time T1 and the value of the input capture register (ICR) at that time is represented by TPC1. By subtracting TPC0 from TPC1, the number of pulses that occurred during the time span from time T0 to time T1 can easily be calculated.

Since the frequency of wave form 3B is known and the total pulse count TPC that occurred during one period of the wave form 3A is known, the period P of the carrier signal 80 can easily be calculated. However, in a preferred embodiment of the present invention, the frequency of the carrier signal 80 is determined directly by matching the total pulse count TPC in a look-up table to its corresponding frequency. An exemplary look-up table used to perform this function is illustrated in Table I below:

TABLE I

| TPC | CARRIER FREQUENCY |
|---|---|
| 136 | 7.35 kHz |
| 128 | 7.81 kHz |
| 120 | 8.33 kHz |
| 112 | 8.93 kHz |
| 104 | 9.62 kHz |
| 96 | 10.42 kHz |
| 80 | 12.50 kHz |
| 72 | 13.89 kHz |

As can be seen in Table I, a total pulse count (TPC) of approximtely 80 would be expected if the carrier frequency is 12.5 kHz. Therefore, by comparing the total pulse count TPC, which is calculated by subtracting TPC0 from TPC1, to the entries of the look-up table, the frequency which most closely matches the total pulse count TPC can be determined to be the prescribed carrier frequency for the transceiver. As can be seen in Table I, the eight frequencies used in this preferred embodiment of the present invention result in total pulse counts (TPC) that differ by eight pulses from their nearest alternative value. Therefore, if the calculated value of the pulse count interval between negative edges of the carrier wave is compared to the values shown in Table I, an error of ±3 pulse counts will still result in the proper selection of the prescribed frequency. For example, measured values of TPC that range from 77 to 83 will result in the selection of 12.5 kHz from the look-up table.

It should be noted that the value of TPC0 will almost never be zero. This is due to the fact that the 1 mHz signal, wave form 3B, begins immediately upon a power-up, whereas the first occurrence of the input capture flag (ICF) at time T0 is necessarily delayed by some small period of time from the first instance of a power-up condition. During this short period of time, various reset functions are performed by the microprocessor and the input capture flag (ICF) is set. For example, data list pointers are initialized and I/O ports are configured immediately after a power-up sequence begins. Only then, after the setting of the input capture flag (ICF), will a subsequent negative edge NE of the carrier signal 80 cause the interrupt program to execute.

Figure 4:
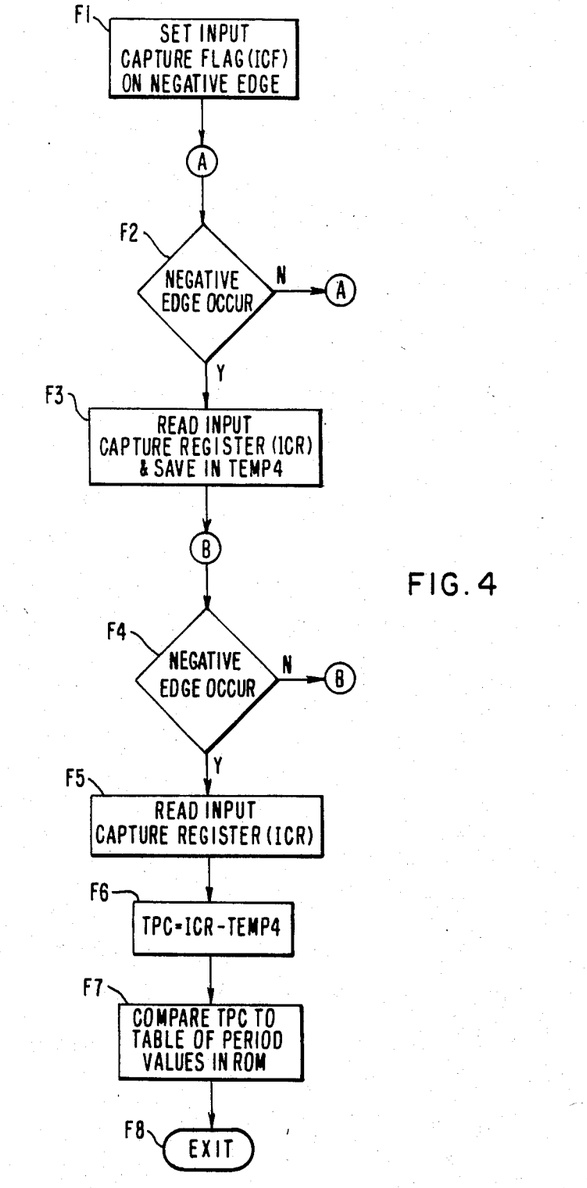
FIG. 4 is a flow chart representing the logical steps performed by the present invention.

FIG. 4 illustrates a flow chart which represents the logical functions performed by the program of the present invention. As indicated by function block F1, the program first sets the input capture flag (ICF) to be enabled on a subsequent negative edge of the associated wave form. Next, the program executes a tight loop of rapidly repeated instructions, as illustrated by logic block F2, in which it watches for a change in the status of the input capture flag which would indicate the occurrence of a negative edge of the associated wave form. If the negative edge has not occurred, the program immediately looks at it again. The program will continue to observe this input capture flag until it changes. When the program observes that the negative edge has occurred, as indicated by the change of status of the input capture flag (ICF), it immediately reads the value of the input capture register (ICR) and stores it for future reference. This step is indicated by logic block F3 in which the initial value of the input capture register is stored in a variable called TEMP4. This would occur at time T0 in FIG. 3. After storing the initial value of the input capture register (ICR), the program immediately goes into another tight loop, as indicated by logic block F4, in which it watches for the next occurrence of a negative edge of the associated wave form. Until this subsequent negative edge occurs, the program will continue to watch for it. When the negative edge occurs, as would be indicated by the change of status of the input capture flag (ICF), the program immediately reads the value of the input capture register (ICR), as indicated by logic block F5, and calculates the total pulse count by subtracting the value of TEMP4 from the most recent value of the input capture register (ICR).

Comparing FIGS. 3 and 4, it should be understood that the value of the variable TEMP4 is equivalent to the value TPC0 indicated in FIG. 3. Furthermore, the value of ICR in logic block F6 would contain the value of TPC1 in FIG. 3. Therefore, after the calculation is performed at logic block F6, the measured value of TPC, the total pulse count occurring between subsequent negative edges of the wave form 80, is known. Following this calculation, the program would compare this value of TPC to the look-up table stored in read-only memory (ROM) as indicated by logic block F7 of FIG. 4. Following this determination of the precise prescribed frequency of the carrier signal, the program would exit, as illustrated by logic block F8.

It should be understood that the actual determination of the carrier signal frequency is not the final step taken by the microprocessor during the power-up sequence. After the prescribed carrier frequency is determined, this value is compared to a storage location in the NOVRAM (reference numerals U2 and U3 in FIG. 1) in which the previously known value of the prescribed carrier frequency was stored. If these two values are identical, the microprocessor would continue to operate in a normal manner. However, if these two values are not identical, the storage location in the NOVRAM is changed to correspond with the recently determined carrier frequency value and an alarm location is set in order that this discrepancy can be communicated to a central station at a later time. Therefore, if the stored value of the prescribed carrier frequency has been adversely affected because of some transient condition, such as a lightning storm, the transceiver made in accordance with the present invention can still operate properly because it now has determined what its prescribed frequency is and can both receive and transmit messages at that frequency. However, for information purposes, the alarm signal is transmitted to the central station in order that the previous existence of the transient condition will be known.

Upon initial manufacture of a transceiver made in accordance with the present invention, the stored value of the prescribed frequency is, of course, zero or some other improper value. However, it should be apparent from the above discussion that the transceiver will determine its own proper prescribed frequency upon the occurrence of the first power-up sequence. Therefore, the present invention provides a means for permitting the transceiver to determine its own prescribed frequency, based on its output transmission carrier frequency, so that the transceiver can determine its frequency upon the occurrence of an adverse transient condition which partially affects its memory or upon initial installation following manufacture. Although the present invention has been described in considerable detail, it should be understood that alternative embodiments are to be considered within the scope of the present invention. In order to more fully understand the description of the preferred embodiment of the present invention, particular values of its components are described in Table II.

TABLE II

| Reference Numeral | Type or Value |
| --- | --- |
| U2 | Type 2212 (XICOR) |
| U3 | Type 2212 (XICOR) |
| U4 | Type 6801U4 (Motorola) |
| U5 | Semi-Custom Chip |
| U6 | Type 3140 |
| U7 | Type 74HC03 (Quad 2-Input Open Drain NAND gate) |
| C17 | 39 pf |
| C18 | 39 pf |
| C21 | .1 µf |
| D4 | Type 1N4148 |
| R1 | 12KΩ |
| R2 | 1KΩ |
| R3 | 3KΩ |
| Y1 | 4 mHz Crystal |
| 34* | 2-input EOR |
| 60* | Inverter |
| 62* | 2-Input NAND |
| 64* | 2-Input OR |
| 72* | Inverter |

*These components are incorporated in semi-custom chip U5

What we claim is:

1. A transceiver, comprising: means for transmitting a modulated signal, said modulated signal being a carrier signal having a first frequency modulated with a base band data message;
    first means for generating said carrier signal, said first generating means being connected in signal communication with said transmitting means;
    a microprocessor having an input connected to an output of said first generating means comprising second means for generating an input signal upon the occurrence of a preselected edge of said carrier signal, said second generating means being connected in signal communication with said first generating means;
    said microprocessor further comprising means for logging elapsed time, said logging means being responsive to a second frequency, said second frequency being higher than said first frequency, said logging means comprising a means for counting pulses of said second frequency and storing a representation of an accumulated value of said pulses, each of said pulses being representative of a preselected period of time;
    said microprocessor further comprising means for comparing two values of said accumulated value representation of said elapsed time to determine an interval between two of said occurrences of said preselected edge of said carrier signal, said comparing means being connected in signal communication with said logging means; and
    means for storing said interval.

2. The transceiver of claim 1, wherein:
    said microprocessor further comprises means for comparing said interval to a table of exemplary interval values corresponding to a plurality of possible carrier frequencies.

3. The transceiver of claim 2, wherein:
    said table comprises eight of said exemplary internal values.

4. A method of determining a carrier signal frequency, comprising:
    generating said carrier signal;
    generating a periodic signal having a frequency higher than said carrier signal frequency;
    counting sequential pulses of said periodic signal;
    storing a first instantaneous pulse count value of said counting step upon a first occurence of a preselected edge of said carrier signal;
    storing a second instantaneous pulse count value of said counting step upon a second occurrence of said preselected edge of said carrier signal;
    comparing said first and second instantaneous pulse count values to determine an elapsed time between said first and second occurrences of said preselected edge of said carrier signal; and
    comparing said elapsed time to a table of time values for a preselected number of exemplary frequencies.

* * * * *